United States Patent [19]
Raje

[11] Patent Number: 5,463,326
[45] Date of Patent: Oct. 31, 1995

[54] OUTPUT DRIVERS IN HIGH FREQUENCY CIRCUITS

[75] Inventor: Prasad A. Raje, Fremont, Calif.

[73] Assignee: Hewlett-Packard Company, Palo Alto, Calif.

[21] Appl. No.: 46,540

[22] Filed: Apr. 13, 1993

[51] Int. Cl.⁶ ............................................... H03K 3/26
[52] U.S. Cl. .......................... 326/30; 326/86; 326/58; 327/185; 327/409
[58] Field of Search ........................... 327/99, 185, 355, 327/407, 408, 410, 409; 326/56, 57, 58, 86, 30; 307/98

[56] References Cited

U.S. PATENT DOCUMENTS

| | | | |
|---|---|---|---|
| 3,937,982 | 2/1976 | Nakajima | 326/98 |
| 4,029,971 | 6/1977 | Pryor | 326/58 |

FOREIGN PATENT DOCUMENTS

| | | |
|---|---|---|
| 0196113A2 | 10/1986 | European Pat. Off. . |
| 63-158112 | 7/1988 | Japan . |
| 2-39619 | 2/1990 | Japan . |
| 2-301215 | 12/1990 | Japan . |
| 4-86119 | 3/1992 | Japan . |
| 4-100409 | 4/1992 | Japan . |
| 2249444 | 5/1992 | United Kingdom . |

OTHER PUBLICATIONS

Knight, Thomas, F., "A Self-Terminating Low-Voltage Swing CMOS Output Driver", IEEE Journal of Solid-State Circuits, vol. 23, No. 2, Apr. 1988, pp. 457–464.

DeHon, Andre et al., "Automatic Impedance Control", IEEE International Solid-State Circuits Conference, 1993, pp. 164–165.

Primary Examiner—William M. Shoop, Jr.
Assistant Examiner—Peter Ganjoo

[57] ABSTRACT

A high frequency circuit using output drivers with tri-state sections. The plurality of output drivers are connected to an output transmission line. Each driver has a pull-up section, a pull-down section and a tri-state section. Each tri-state section has a low impedance and a high impedance state. Its low impedance state serves to match the impedance of the output transmission line. Its high impedance state isolates its driver from the output transmission line.

12 Claims, 5 Drawing Sheets

OUTPUT DRIVERS IN HIGH FREQUENCY CIRCUITS

BACKGROUND OF THE INVENTION

The present invention relates generally to high frequency circuits and more particularly to output drivers in high frequency circuits.

Digital communication among integrated circuits operating in high data rates requires transmission lines, which are connected to the circuits' output drivers. The characteristic impedances of the transmission lines should be matched to impedances of the output drivers.

FIG. 1 shows a typical CMOS output driver connected to an output transmission line with a characteristic impedance Zo. In operation, when an input voltage Vi is at a low logic level, the pull-up section of the CMOS output driver (the PMOS transistor) is at a low impedance state. The impedance of the low impedance state is substantially equal to Zo to serially terminate the impedance of the output transmission line. With the PMOS transistor at the low impedance state, Vcc is coupled to the output transmission line. By voltage division, half of Vcc travels down the output transmission line from point X. The other end of the output transmission line, point Y, is usually a gate of another circuit, which typically has a very high impedance. When half of Vcc reaches point Y, it will be reflected back through the output transmission line. Due to the reflected signal directly adding to the incident signal, the level of voltage at point Y becomes approximately Vcc, the high logic level. This Vcc signal propagates back towards point X. Once it reaches point X, this signal turns the PMOS off, and the circuit in FIG. 1 is in its stable state. Similarly, if Vi is at the high logic level, point Y, in its stable state, would be at the low logic level.

If there are a plurality of CMOS output drivers connected to an output transmission line, each driver should have a switch. There is a need to effectively connect the plurality of output drivers with switches to drive the output transmission line.

It will be apparent from the foregoing that there is still a need for a high frequency circuit that effectively combines output drivers with switches to drive an output transmission line.

SUMMARY OF THE INVENTION

The present invention is embodied in a high frequency circuit with an output driver driving an output transmission line. The impedance of the output driver is substantially matched to the impedance of the output transmission line.

The output transmission line has a characteristic impedance Zo. The driver is coupled to a first end of the output transmission line. The second end of the output transmission line is typically at a high impedance.

The driver includes a pull-up section, a pull-down section and a tri-state section. The pull-up section is connected between a first terminal and a second terminal; the pull-down section is connected between a third terminal and the second terminal; and the tri-state section is connected between the second terminal and the first end of the output transmission line.

In operation, both the pull-up and the pull-down section respond to an input signal. If the input signal assumes a second logic level, the pull-up section provides a low impedance current path between the first terminal and the second terminal. This low impedance current path establishes a first logic level at the second terminal. The low impedance current path has an impedance Zd.

If the input signal assumes the first logic level, the pull-down section provides a low impedance current path between the third terminal and the second terminal. This low impedance current path establishes the second logic level at the second terminal. The low impedance current path of the pull-down section has an impedance that is substantially equal to Zd.

The tri-state section responds to a control signal to assume one of a high impedance state and a low impedance state. The tri-state section, in its high impedance state, substantially isolates the second terminal from the output transmission line. In its low impedance state, the tri-state section couples the second terminal to the output transmission line through an impedance Zc that is substantially equal to (Zo–Zd).

In another preferred embodiment, the present invention has a plurality of output drivers similar to the type just described. All the output drivers drive the output transmission line.

Of all the output drivers, only one tri-state section is controlled by its control signal to its low impedance state at any given time so that its second terminal is coupled to the output transmission line. All the other output drivers are substantially isolated from the output transmission line.

The tri-state section in each driver functions both as a switch and as a part of the serial termination for the output transmission line. With the tri-state section, the impedance of the output driver connected to the output transmission line is substantially matched to the impedance of the output transmission line.

Other aspects and advantages of the present invention will become apparent from the following detailed description, taken in conjunction with the accompanying drawings, illustrating by way of example the principles of the invention.

DESCRIPTION OF THE PREFERRED EMBODIMENTS

The present invention provides a high frequency circuit with a plurality of output drivers driving an output transmission line. Each driver has a tri-state section, which is set by a control signal. Depending on the value of the control signal on its tri-state section, a driver is either impedance matched to or isolated from the output transmission line.

Figure 1:
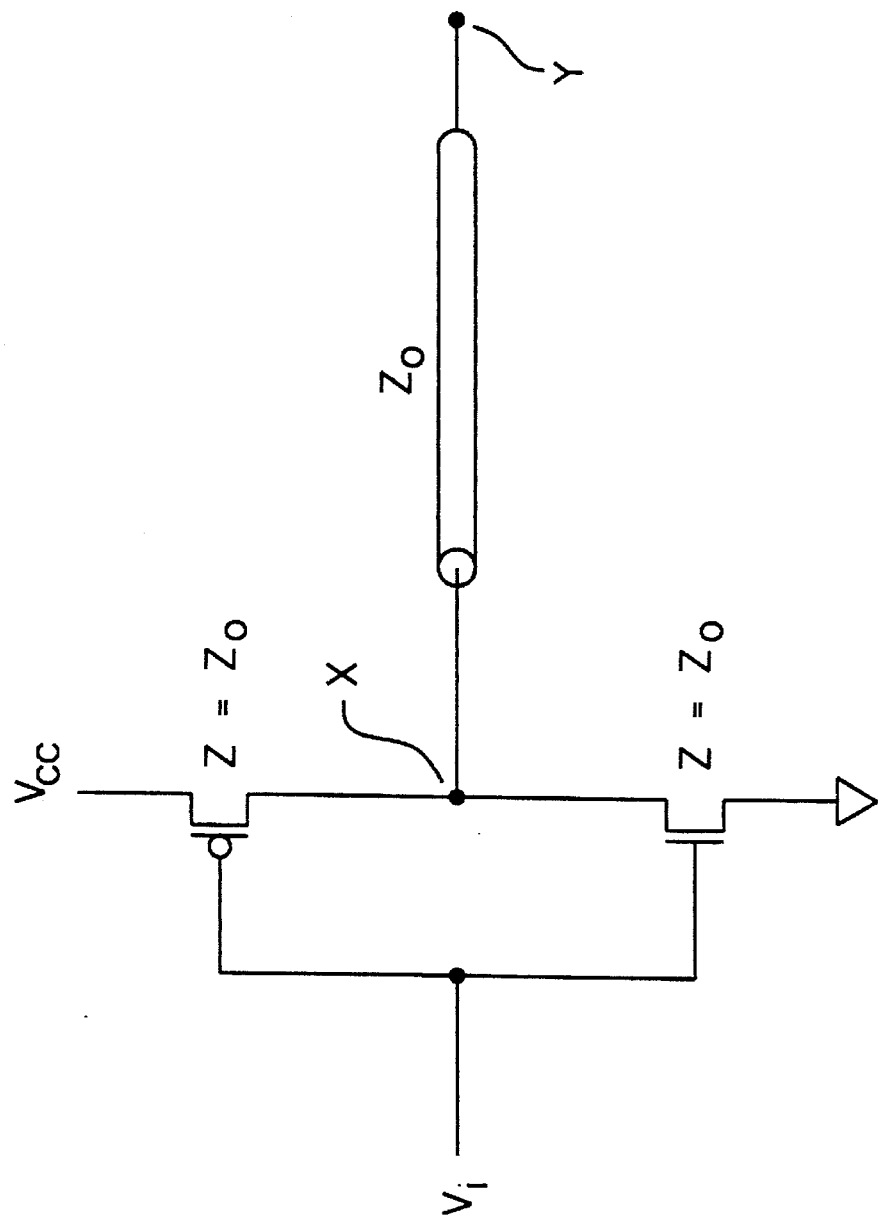
FIG. 1 shows a high frequency output driver in the prior art.
Figure 2:
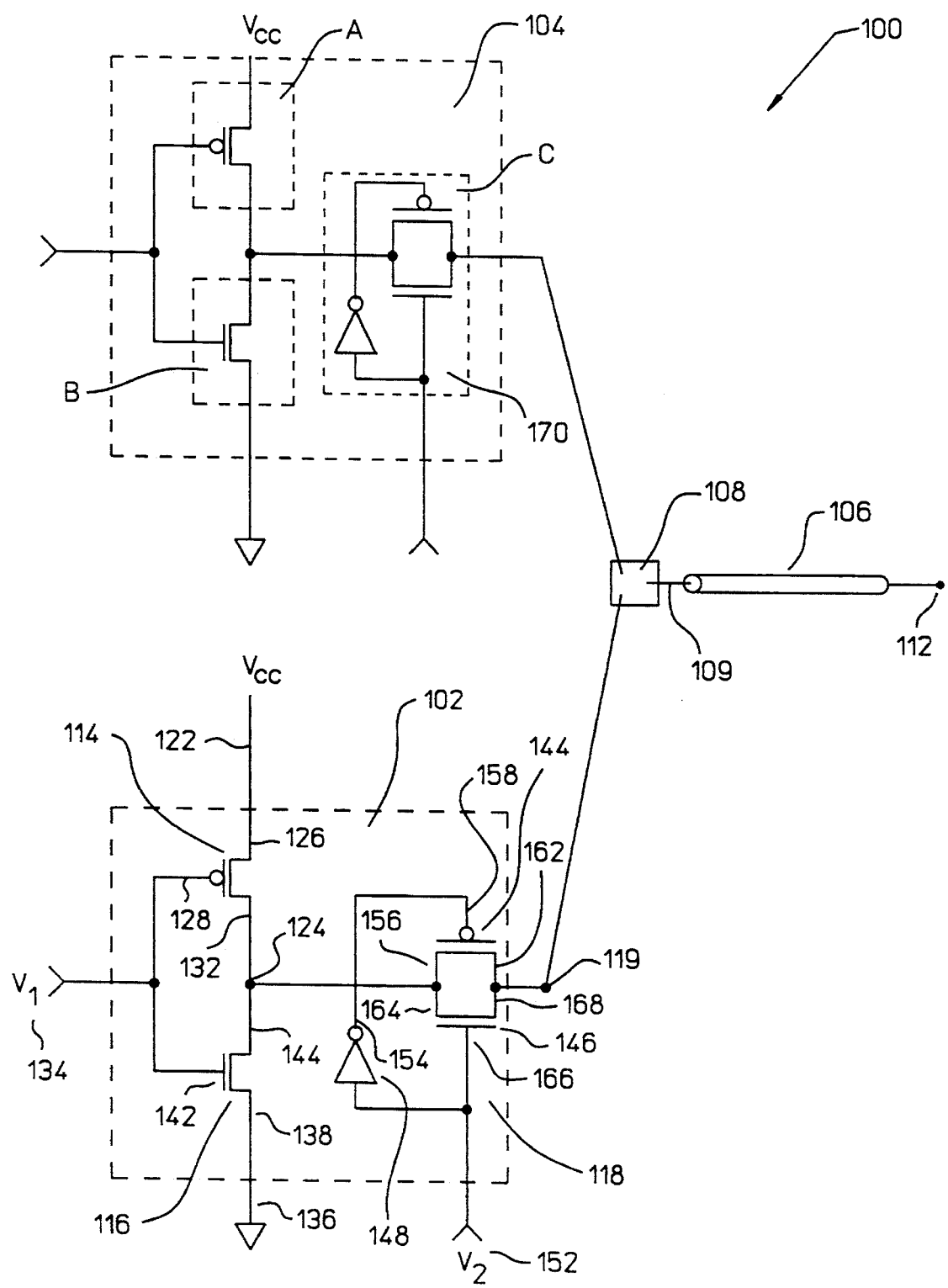
FIG. 2 shows a first preferred embodiment of the invention.

FIG. 2 shows a first preferred embodiment 100 of the invention. A plurality of output drivers, 102 and 104, reside on an integrated circuit, which is not shown, and all of them drive an output transmission line 106, which may be off the integrated circuit. The output transmission line 106 has a characteristic impedance Zo, which is preferably 50 ohms. The output transmission line 106 has a first end 109 and a second end 112. The first end 109 is connected to an output pin 108. The second end 112 is typically at a high impedance point, which means that the end can, for example, be left open or connected to a circuit with a high input impedance as desired.

Each driver includes a pull-up section A, a pull-down section B and a tri-state section C.

For the driver 102, the pull-up section, preferably comprises a PMOS transistor 114 connected between a first terminal 122 and a second terminal 124. The first terminal 122 is preferably at a high logic level. The PMOS transistor 114 has a source 126, a gate 128 and a drain 132. The drain 132 is connected to the second terminal 124; the source 126 is connected to the first terminal 122; and the gate 128 receives an input signal 134.

The pull-down section, preferably comprises an NMOS transistor 116 connected between a third terminal 136 and the second terminal 124. The third terminal 136 is preferably at a low logic level. The NMOS transistor 116 has a source 138, a gate 142 and a drain 144. The source 138 is connected to the third terminal 136; the drain 144 is connected to the second terminal 124; and the gate 142 receives the input signal 134.

The tri-state section 118 is connected between the second terminal 124 and the output pin 108 of the integrated circuit. The tri-state section 118 preferably includes a PMOS transistor 142, an NMOS transistor 146 and an inverter 148. The NMOS transistor 146 is in parallel to the PMOS transistor 142. The inverter 148 receives a control signal 152 of the tri-state section 118, and has an output 154. The PMOS transistor 144 has a drain 156, a gate 158 and a source 162. The gate 158 is connected to the output 154 of the inverter 148. The NMOS transistor 146 has a drain 164, a gate 166 and a source 168. The drain 164 is connected to the drain 156 of the PMOS transistor 144, and is also connected to the second terminal 124; the source 168 is connected to the source 162 of the PMOS transistor 144, and is also connected to the output pin 108; and the gate 166 receives the control signal 152 of the tri-state section 118. The source and the drain of both the PMOS transistor 144 and the NMOS transistor 146 are interchangeable in position. In another preferred embodiment, the tri-state section 118 only has either a PMOS transistor or an NMOS transistor.

In operation, if the input signal 134 assumes the low logic level, the PMOS transistor 114 of the pull-up section provides a low impedance current path between the first terminal 122 and the second terminal 124. The low impedance current path establishes the high logic level at the second terminal 124. Also, the low impedance current path has an impedance Zd.

If the input signal 134 assumes the high logic level, the NMOS transistor 116 of the pull-down section responds to the input signal 134 to provide a low impedance current path between the third terminal 136 and the second terminal 124. The low impedance current path establishes the low logic level at the second terminal 124. The low impedance current path also has an impedance that is substantially equal to Zd.

The tri-state section 118 is set by the control signal 152 into either a low impedance state or a high impedance state. The low impedance state is established by the control signal 152 having a high logic level; the high impedance is established by the control signal 152 having a low logic level.

When the tri-state section 118 is in the low impedance state, the NMOS transistor 146 is in a first low impedance state, and the PMOS transistor 144 is in a second low impedance state. The first and the second low impedance state in parallel has an impedance Zc, which is substantially equal to (Zo–Zd). Thus, the total impedance of the tri-state section 118 with either the pull-up section PMOS transistor 114 or the pull-down section NMOS transistor 116 is substantially Zo, the characteristic impedance of the output transmission line 106. This matches the impedance of the output transmission line 106 to the impedance of the output driver 102.

When the tri-state section 118 is in the high impedance state, both the PMOS transistor 144 and the NMOS transistor 146 are in their corresponding high impedance state. This high impedance state substantially isolates the second terminal 124 from the output transmission line 106.

For the plurality of output drivers, such 102 and 104, only one tri-state section is set by its control signal to its low impedance state. All the other tri-state sections are set to their high impedance states. For example, only the tri-state section 118 is set to its low impedance state, and the tri-state section 170 is set to be at its high impedance state. This leads to the second terminal 124 of the output driver 102 coupling to the output transmission line 106. Hence, the voltage on the output transmission line 106 is set by the output driver 102.

With the plurality of drivers all connected to one output pin 108, the present invention reduces the number of output pins required by the high frequency circuit.

Figure 3:
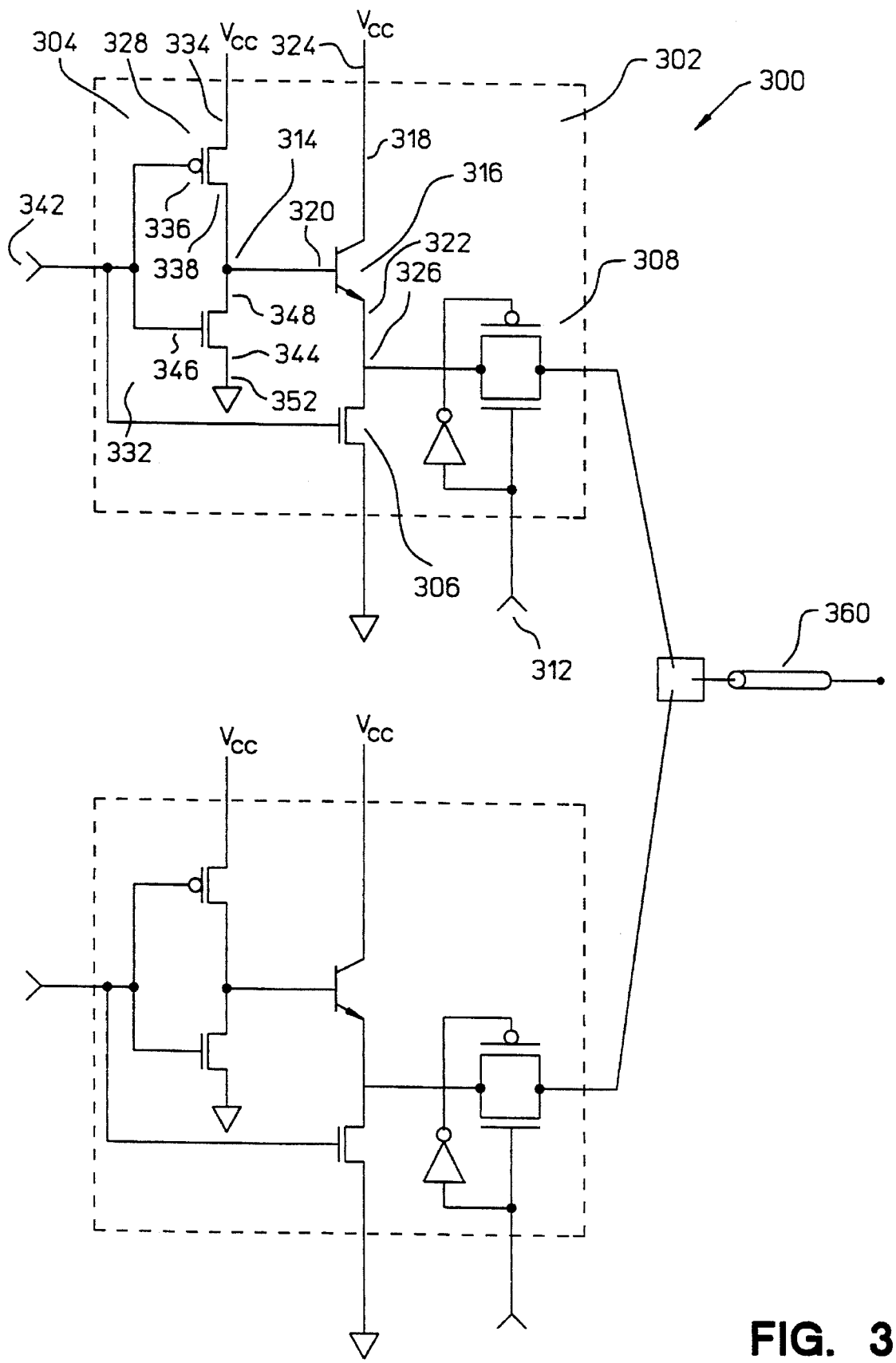
FIG. 3 shows a second preferred embodiment of the invention.

FIG. 3 shows a second preferred embodiment 300 of the invention. It is similar in structure and operation to the first preferred embodiment 100. For each output driver, such as 302, the pull-down section 306 still preferably comprises an NMOS transistor; the tri-state section 308 is still preferably controlled by a control signal 312 into either a high impedance state or a low impedance state. However, the pull-up section 304 preferably includes a CMOS circuit 314 driving a bipolar transistor 316.

The bipolar transistor 316 has a collector 318, a base 320 and an emitter 322. The collector 318 is connected to the first terminal 324. The emitter 322 is connected to the second terminal 326.

The CMOS circuit 314 includes a PMOS transistor 328 and an NMOS transistor 332. The PMOS transistor 328 has a source 334, a gate 336 and a drain 338. The drain 338 is connected to the base 320 of the bipolar transistor 316. The source 334 is connected to the first terminal 324. The gate 336 receives the input signal 342. The NMOS transistor 332 also has a source 344, a gate 346 and a drain 348. The drain 348 is connected to the base 320 of the bipolar transistor 316. The source 344 is connected to the third terminal 352. The gate 346 receives the input signal 342.

In operation, both the pull-up section 304, the pull-down section 306 and the tri-state section 412 respond to the input signal 342 as in the first embodiment. Only the operation of the pull-up section 304 is further described here. If the input signal 342 assumes the low logic level, the second terminal 326 assumes the high logic level by having a low impedance current path between the first terminal 324 and the second terminal 326. This low impedance current path has an impedance Zd. The sum of this impedance with the impedance of the tri-state circuit 308 in its low impedance state is substantially equal to the characteristic impedance of the output transmission line 360. Thus, again, the tri-state circuit 308 serves as both a switch and a part of the termination impedance. When the tri-state section 308 is at its high impedance state, it isolates the output driver 302 from the output transmission line 360. When the tri-state section 308 is at its low impedance state, it serves as a part of the termination impedance to match with the impedance of the output transmission line 360.

Figure 4:
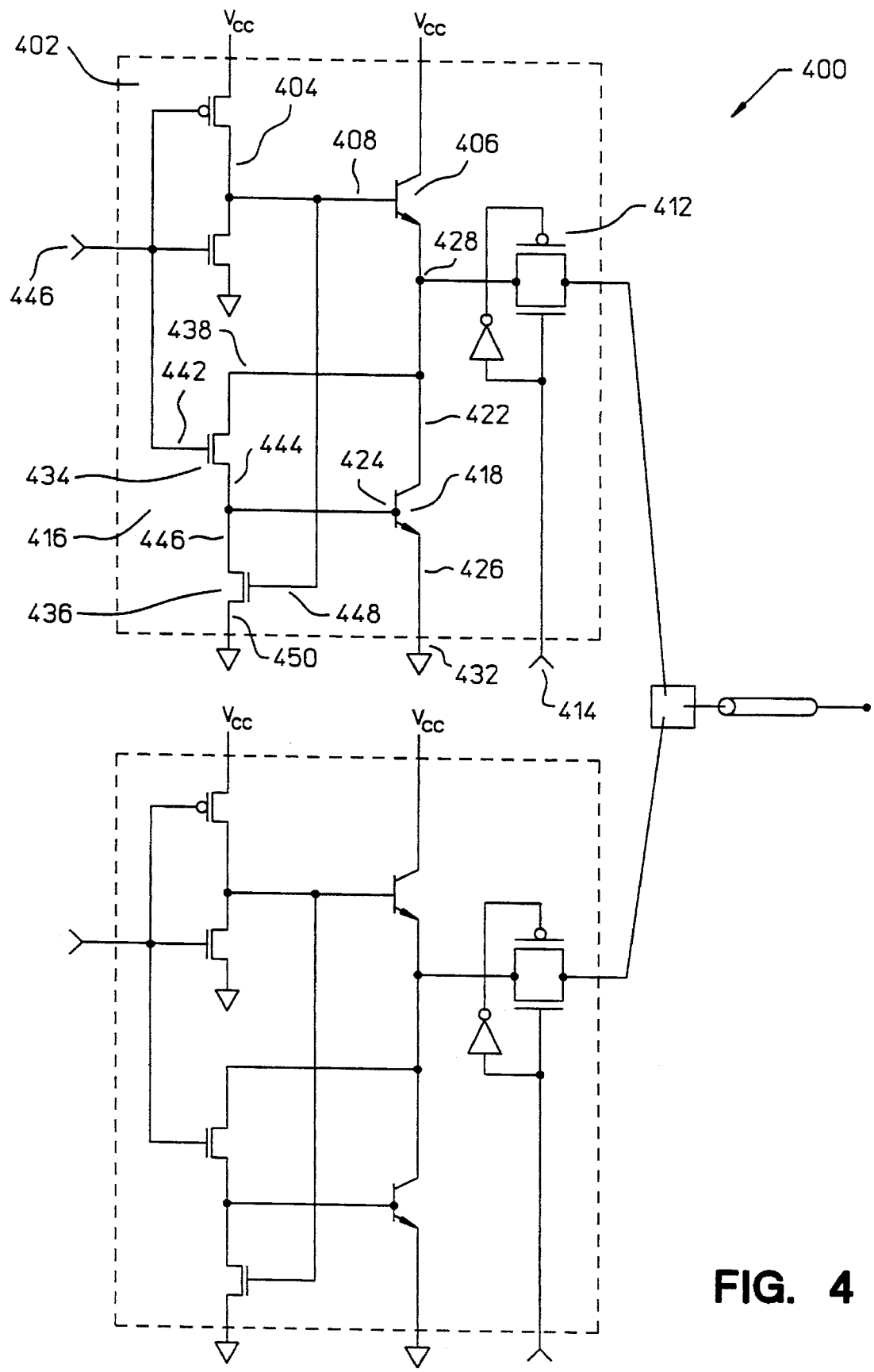
FIG. 4 shows a third preferred embodiment of the invention.

FIG. 4 shows a third preferred embodiment 400 of the invention. It is similar in structure and operation as the second preferred embodiment 300. The pull-up section 402 still preferably includes a CMOS circuit 404 driving a bipolar transistor 406. The bipolar transistor 406 has a base 408. The tri-state section 412 is still preferably set by a control signal 414 into either a high impedance state or a low impedance state.

However, the pull-down section 416 preferably includes NMOS transistors driving a bipolar transistor 418. The bipolar transistor 418 has a collector 422, a base 424 and an emitter 426. The collector 422 is connected to the second terminal 428. The emitter 426 is connected to the third terminal 432.

The NMOS transistors includes a first NMOS transistor 434 and a second NMOS transistor 436. The first NMOS transistor 434 has a drain 438, a gate 442 and a source 444. The drain 438 is connected to the second terminal 428. The gate 442 receives the input signal 446. The source 444 is connected to the base 424 of the bipolar transistor 418.

The second NMOS transistor 436 also has a drain 446, a gate 448 and a source 450. The drain 446 is connected to the base 424 of the bipolar transistor 418. The gate 448 is connected to the base 408 of the bipolar transistor 406 in the pull-up section 402. The source 450 is connected to the third terminal 432.

In operation, the pull-up section 402, the pull-down section 416 and the tri-state section 412 respond to the input signal 446 as in the first embodiment 100. They will not be further described.

Figure 5:
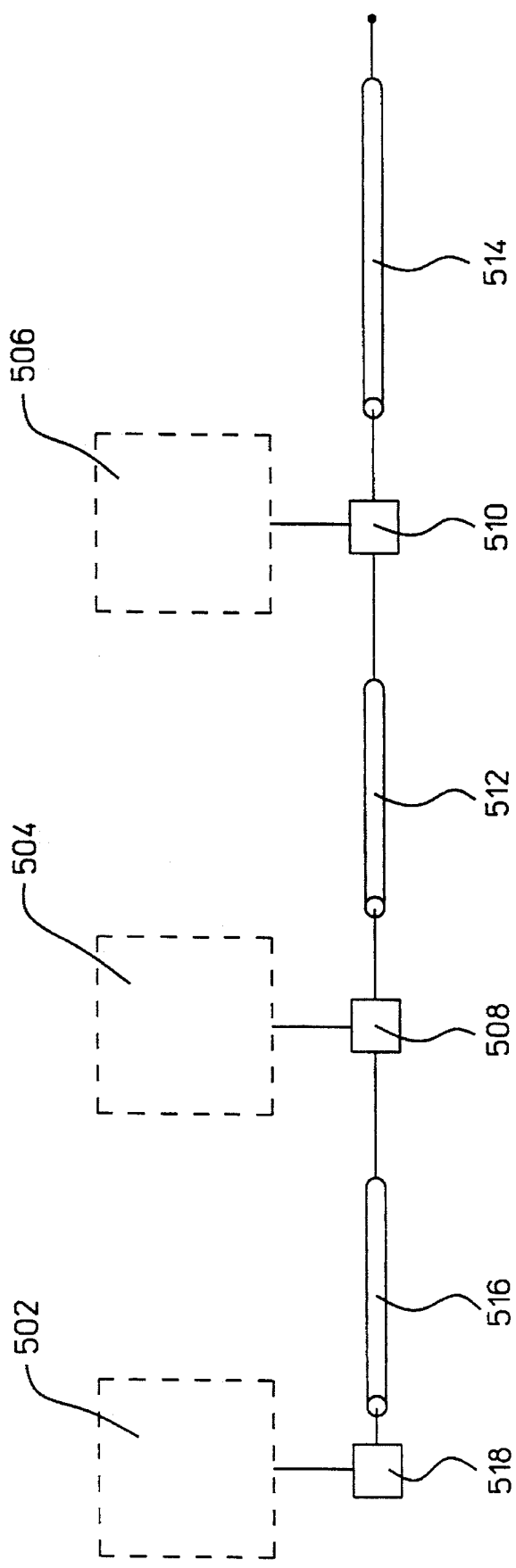
FIG. 5 shows a plurality of output drivers of the invention connected by intermediate transmission lines to drive an output transmission line.

The plurality of drivers do not have to reside on one integrated circuit. FIG. 5 shows three output drivers, 502, 504 and 506, and two intermediate transmission lines, 512 and 516. Each driver, represented by a dotted box, can be one of the preferred embodiments. So, the dotted box in FIG. 5 can be substituted by drivers shown in FIG. 2, FIG. 3 or FIG. 4. Each driver is connected to an output pin; for example, the output driver 504 is connected to an output pin 508.

The intermediate transmission lines may be on the integrated circuit or may be off the integrated circuit. They connect the output pins to the output transmission line; for example, intermediate transmission lines 516 and 512 connect the output pin 518 to the output transmission line 514. The characteristic impedances of the intermediate transmission lines are substantially equal to the characteristic impedance Zo of the output transmission line. Each intermediate transmission line is connected to at least one output pin; for example, the intermediate transmission line 516 is connected to the output pin 508.

For each driver, its input signal has a rise time. One way to define the rise time of an input signal is the time required for the level of the input signal to go from 10% to 90%.

The total lengths of the intermediate transmission lines is preferably limited by the rise times of the input signals. An artificial transmission line with a characteristic impedance of Zo and with a length equal to twice the sum of the lengths of all the intermediate transmission lines is established. The time needed Td for every input signal to propagate through this artificial transmission line is substantially less than the rise time of that input signal. In one preferred embodiment, the time needed Td is preferably less than half of the fastest rise time of all the input signals.

The present invention is on a high frequency circuit that effectively connects a plurality of output drivers to an output transmission line. Each driver uses a tri-state section to either match the impedance of the output transmission line or to isolate the driver from the output transmission line.

Other embodiments of the invention will be apparent to the skilled in the art from a consideration of this specification or practice of the invention disclosed herein. It is intended that the specification and examples be considered as exemplary only, with the true scope and spirit of the invention being indicated by the following claims.

I claim:

1. A high frequency circuit comprising an output driver driving an output transmission line, the output transmission line having a characteristic impedance Zo and having a first and a second end, the driver comprising:

a pull-up section connected between a first terminal and a second terminal, the pull-up section responding to an input signal to provide a low impedance current path between the first terminal and the second terminal for establishing a first logic level at the second terminal if the input signal assumes a second logic level, the low impedance current path having an impedance Zd;

a pull-down section connected between a third terminal and the second terminal, the pull-down section responding to the input signal to provide a low impedance current path between the third terminal and the second terminal for establishing the second logic level at the second terminal if the input signal assumes the first logic level, the low impedance current path having an impedance that is substantially equal to Zd; and a tri-state section, having an output, connected between the second terminal and the first end of the output transmission line, responsive to a control signal to assume one of a high impedance state and a low impedance state, the tri-state section, in its high impedance state, substantially isolating the second terminal from the output transmission line, and the tri-state section, in its low impedance state, coupling the second terminal to the output transmission line through an impedance Zc that is substantially equal to (Zo−Zd).

2. A high frequency circuit as recited in claim 1 further comprising a plurality of output drivers, each output driver being identical to the one in claim 1, all the output drivers driving the output transmission line;

wherein, at any given time, only one tri-state section is controlled by its control signal to its low impedance state so that its second terminal is coupled to the output transmission line.

3. A high frequency circuit as recited in claim 2, wherein for each output driver:

the pull-up section comprises a PMOS transistor; and the pull-down section comprises an NMOS transistor.

4. A high frequency circuit as recited in claim 2, wherein for each output driver:

the PMOS transistor has a source, a gate and a drain, the source being connected to the first terminal, the drain being connected to the second terminal and the gate receiving the input signal; and the NMOS transistor has a source, a gate and a drain, the drain being connected to the second terminal, the source being connected to the third terminal and the gate receiving the input signal.

5. A high frequency circuit as recited in claim 2, wherein for each output driver:

the pull-up section comprises a CMOS circuit driving a bipolar transistor; and the pull-down section comprises an NMOS transistor.

6. A high frequency circuit as recited in claim 5, wherein for the pull-up section of each output driver:

the bipolar transistor has a collector, a base and an emitter, the collector being connected to the first terminal, and the emitter being connected to the second terminal;

the CMOS circuit comprises:

a PMOS transistor with a source, a gate and a drain, the drain being connected to the base of the bipolar transistor, the source being connected to the first terminal and the gate receiving the input signal; and an NMOS transistor with a source, a gate and a drain, the drain being connected to the base of the bipolar transistor, the source being connected to the third terminal and the gate receiving the input signal; and the NMOS transistor in the pull-down section has a source, a gate and a drain, the drain being connected to the second terminal, the source being connected to the third terminal and the gate receiving the input signal.

7. A high frequency circuit as recited in claim 2, wherein for each output driver:

the pull-up section comprises a CMOS circuit driving a bipolar transistor; and the pull-down section comprises a plurality of NMOS transistors driving a bipolar transistor.

8. A high frequency circuit as recited in claim 7, wherein for the pull-up section of each output driver:

the bipolar transistor has a collector, a base and an emitter, the collector being connected to the first terminal, and the emitter being connected to the second terminal; and the CMOS circuit comprises:

a PMOS transistor with a source, a gate and a drain, the drain being connected to the base of the bipolar transistor, the source being connected to the first terminal and the gate receiving the input signal; and an NMOS transistor with a source, a gate and a drain, the drain being connected to the base of the bipolar transistor, the source being connected to the third terminal and the gate receiving the input signal; and wherein for the pull-down section of each output driver:

the bipolar transistor has a collector, a base and an emitter, the collector being connected to the second terminal, and the emitter being connected to the third terminal; and the NMOS transistors comprise:

a first NMOS transistor with a drain, a gate and a source, the drain being connected to the second terminal, the gate receiving the input signal and the source being connected to the base of the bipolar transistor; and a second NMOS transistor with a drain, a gate and a source, the drain being connected to the base of the bipolar transistor, the gate being connected to the base of the bipolar transistor in the pull-up section and the source being connected to the third terminal.

9. A high frequency circuit as recited in claim 2, wherein for each output driver, the tri-state section comprises:

a PMOS transistor; and an NMOS transistor parallel to the PMOS transistor; wherein:

the control signal puts the tri-state section into its low impedance state by setting the impedance of the NMOS transistor to be in a first low impedance state while the complement of the control signal sets the impedance of the PMOS transistor to be in a second low impedance.

10. A high frequency circuit as recited in claim 9, wherein each tri-state section further comprises an inverter, the inverter receiving the control signal of the tri-state section and having an output; and wherein for each tri-state section:

the PMOS transistor has a drain, a gate and a source, its gate being connected to the output of the inverter; and the NMOS transistor has a drain, a gate and a source, its drain being connected to the drain of the PMOS transistor, its source being connected to the source of the PMOS transistor, and its gate receiving the control signal.

11. A high frequency circuit as recited in claim 1 further comprising:

a plurality of output drivers, each output driver being identical to the one in claim 1;

one or more intermediate transmission lines, the intermediate transmission lines connecting the output drivers to the output transmission line, each intermediate transmission line having a characteristic impedance that is substantially equal to Zo, and each intermediate transmission line being connected to at least one output driver; and for each driver:

its input signal has a rise time; and the time needed for its input signal to propagate through an artificial transmission line with a characteristic impedance of Zo and with a length equal to twice the sum of the lengths of all the intermediate transmission lines is substantially less than the rise time of its input signal.

12. A high frequency circuit as recited in claim 11 wherein for each driver, the time needed for its input signal to propagate through the artificial transmission line is less than half of the fastest rise time of all the input signals.

* * * * *